US006911857B1

(12) United States Patent
Stiff

(10) Patent No.: US 6,911,857 B1
(45) Date of Patent: Jun. 28, 2005

(54) CURRENT CONTROLLED DELAY CIRCUIT

(75) Inventor: Jonathon C. Stiff, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 151 days.

(21) Appl. No.: 10/305,589

(22) Filed: Nov. 26, 2002

(51) Int. Cl.[7] .............................. H03K 5/13; H03K 17/28
(52) U.S. Cl. ........................ 327/281; 327/288; 327/280; 327/270
(58) Field of Search ................................. 327/231, 266, 327/270, 274, 280, 287, 281, 288; 331/57

(56) References Cited

U.S. PATENT DOCUMENTS

| | | | | |
|---|---|---|---|---|
| 5,355,097 A | | 10/1994 | Scott et al. ................... 331/14 |
| 5,994,939 A | * | 11/1999 | Johnson et al. ............. 327/280 |
| 6,043,719 A | * | 3/2000 | Lin et al. ...................... 331/57 |
| 6,133,773 A | * | 10/2000 | Garlepp et al. ............. 327/247 |
| 6,396,357 B1 | * | 5/2002 | Sun et al. ...................... 331/57 |

OTHER PUBLICATIONS

John G. Maneatis, Low–Jitter Process–Independent DLL and PLL Based on Self–Biased Techniques, IEEE Journal of Solid–State Circuits, vol. 31, No. 11, Nov. 1996, pp. 1723–1732.

Patrik Larsson, A 2–1600–MHz CMOS Clock Recovery PLL with Low–V dd Capability, IEEE Journal of Solid–State Cuircuits, vol. 34, No. 12, Dec. 1999, pp. 1951–1960.

* cited by examiner

*Primary Examiner*—Dinh T. Le
(74) *Attorney, Agent, or Firm*—Blakely Sokoloff Taylor & Zafman LLP

(57) ABSTRACT

A current controlled delay circuit is disclosed. Two currents of constant sum are generated to control the delay of the circuit. The circuit includes a differential pair to switch one of the two currents from one leg of the circuit to another leg of the circuit. The circuit includes a cross-coupled pair to switch the other of the two currents from one leg of the circuit to another leg of the circuit. The circuit may include a fixed or variable load.

15 Claims, 6 Drawing Sheets

CURRENT CONTROLLED DELAY CIRCUIT

TECHNICAL FIELD

Embodiments of the invention generally relate to the field of delay circuitry, and more specifically, to a current controlled delay circuit.

BACKGROUND

A conventional delay cell 100 is shown in FIG. 1. The delay cell 100 includes a plurality of Metal-Oxide Semiconductor Field-Effect Transistors (MOSFETs), such as 104 and 106. MOSFETs 104 and 106 comprise a differential pair, which switches the current 110 from one output leg to another output leg based on the voltage difference between input voltages 112 and 114. When the difference between input voltages 112 and 114 is greater than zero, current 110 flows in output leg 120. If the difference between the input voltages is less than zero, current flows in output leg 122.

The delay cell 100 includes a current source 108, voltage-controlled resistances 124 and 126, and output load capacitances 130 and 132. The voltage-controlled resistances 124 and 126 control the delay of the circuit 100. The delay is defined by the time it takes the RC (voltage controlled resistance-load capacitance product) voltage rise of one output leg of the delay cell to equal the RC voltage decay of the other output leg after the difference of inputs 114 and 118 transitions, switching the current 110 from one output leg to the other output leg. This is modeled by the following equation: $IR(1-e^{-1/RC})=I\,RE^{-1/RC}$, where I is the current 110 provided by the current source 108 and t is the time delay. Solving for t, the delay through delay cell 100 is t=RCln(2). At low output voltage, the voltage controlled resistances 124 and 126 are modeled by the following equation: $R=1/G_m = 1/B(V_C-V_{THN})$, where $G_m$ is an NMOS transconductance, $V_C$ is the control voltage 102, $V_{THN}$ is the NMOS threshold voltage, and B is the product of the W/L ratio (width divided by length of the transistor), the oxide capacitance $C_{OX}$, and the MOSFET channel mobility. In a ring oscillator composed of N delay cells, the frequency of the circuit is approximately $$F = \frac{1}{2N \times t} = \frac{B(V_C - V_{THN})}{2NC\ln(2)}.$$

Further discussion of conventional delay cells can be found in the articles "Low-Jitter Process-Independent DLL and PLL Based on Self-Biased Techniques" by John Maneatis, IEEE Journal of Solid-State Circuits: Vol. 31, No. 11, November 1996, pp. 1723–1732; and "A 2–1600-MHz CMOS Clock Recovery PLL with Low-Vdd Capability" by Patrik Larsson, IEEE Journal of Solid-State Circuits: Vol. 34, No. 12, December 1999, pp. 1951–1960.

Since the output voltage of the delay cell 100 is between 0 and IR, and R can vary by as much as 5 times to modulate the delay, the value of I must track R to maintain sufficient output voltage swing ($V_{OUT-MAX}$=IR) in the circuit to sustain the signal through a series of delay cells, such as in a delay line or ring oscillator. A feedback structure must -be used to set the product IR equal to a constant reference voltage ($V_{OUT-MAX}=V_{REF}$). This makes the delay of the conventional delay cell 100 sensitive to changes in I. Since $I=V_{REF}/R$ is set by a compensated feedback loop, changes to I occur much more slowly than changes in R for varying control voltage $V_C$. Rapid changes in $V_C$ and R can cause short-term amplitude modulation in $V_{OUT-MAX}$, which will cause delay modulation. $V_{OUT-MAX}$ can also drop low enough within the delay cell to prevent the triggering of the next delay cell in the series, disabling the voltage controlled oscillator (VCO) or delay line of which it is a part of. A solution to this problem is to limit the voltage control signal ($V_C$) modulation bandwidth of the VCO or delay line utilizing this cell. For a phase lock loop (PLL) or delay locked loop (DLL), limiting the modulation bandwidth of the loop's VCO or delay line directly limits the bandwidth of the system.

The conventional delay cell also has a limited linear voltage control range. Beyond a certain range of $V_C$, the voltage-controlled resistances 124 and 126 are no longer a linear function of $V_C$. PLL stability design is more difficult using VCOs with non-linear frequency control and can generate PLLs with greater output noise.

BRIEF DESCRIPTION OF DRAWINGS

The invention may best be understood by referring to the following description and accompanying drawings that are used to illustrate embodiments of the invention. In the drawings.

DETAILED DESCRIPTION

Embodiments of a current controlled delay circuit are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
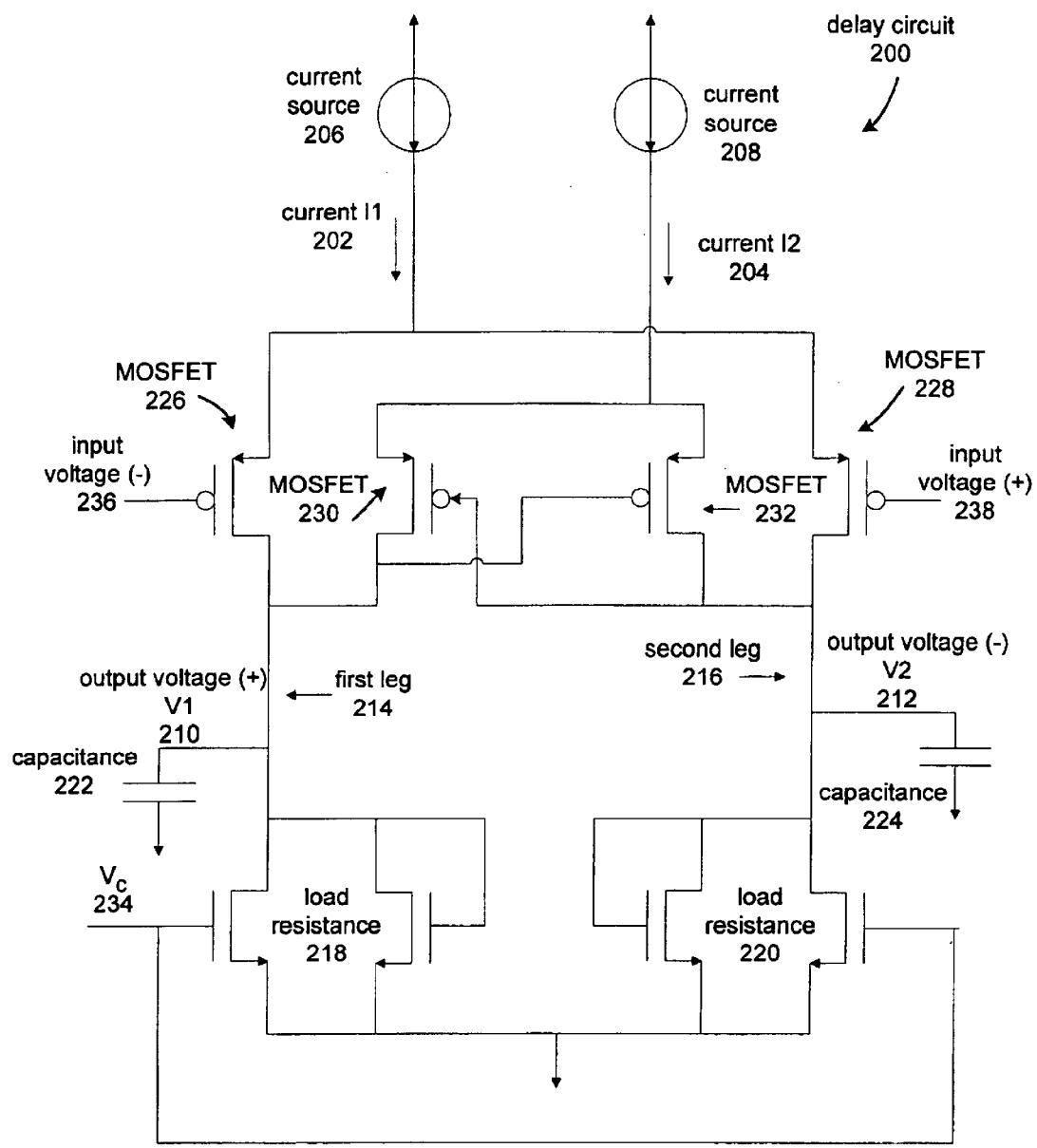
FIG. 2 is a circuit diagram illustrating one embodiment of a current controlled delay circuit using an RC based delay.

Referring to FIG. 2, a circuit diagram illustrating one embodiment of a current controlled delay circuit 200 is shown. In one embodiment, the delay circuit 200 may be used in a current controlled ring oscillator. In one embodiment, the delay circuit 200 may be used in a current controlled delay line. The delay circuit 200 includes 20 one or more current generators, such as 206 or 208, to generate two currents, $I_1$ (202) and $I_2$ (204), of constant sum. In one embodiment, one or more of the current generators are Metal-Oxide Semiconductor Field-Effect Transistors (MOSFETs). In one embodiment, one or more of the current generators are current sources.

The delay circuit 200 includes a plurality of MOSFETs, such as 226, 228, 230, or 232. The MOSFETs 226 and 228 make up a differential pair, which switches current $I_1$ from one output leg to another output leg based on the voltage difference between input voltages 236 and 238. The differential pair is modeled as a switch such that when the difference between input voltages 236 and 238 is greater than zero, current $I_1$ flows in output leg 214. If the difference between input voltages 236 and 238 is less than zero, current $I_1$ flows in output leg 216.

MOSFETs 230 and 232 comprise a cross-coupled pair, which switches the current $I_2$ from one output leg to another output leg based on the voltage difference between output voltages 210 and 212. The cross-coupled pair is modeled as a switch such that when the difference between the output voltages 210 and 212 is greater than zero, current $I_2$ 204 flows in output leg 216. If the difference is less than zero, current $I_2$ flows in output leg 214.

The delay circuit 200 includes a load coupled to the cross-coupled pair and the differential pair. The load may be a fixed load or a variable load. In one embodiment, the load includes two resistances 218 and 220. In one embodiment, the load includes one or more resistors. In one embodiment, the load includes one or more MOSFETs. In one embodiment, the load includes a voltage-controlled resistance, such as the voltage-controlled resistance 124 or 126 shown in FIG. 1. In one embodiment, the delay circuit 200 includes output capacitance loads 222 and 224 on the output legs. In one embodiment, capacitances 222 and 224 are the input capacitances of another delay cell.

Figure 4A:
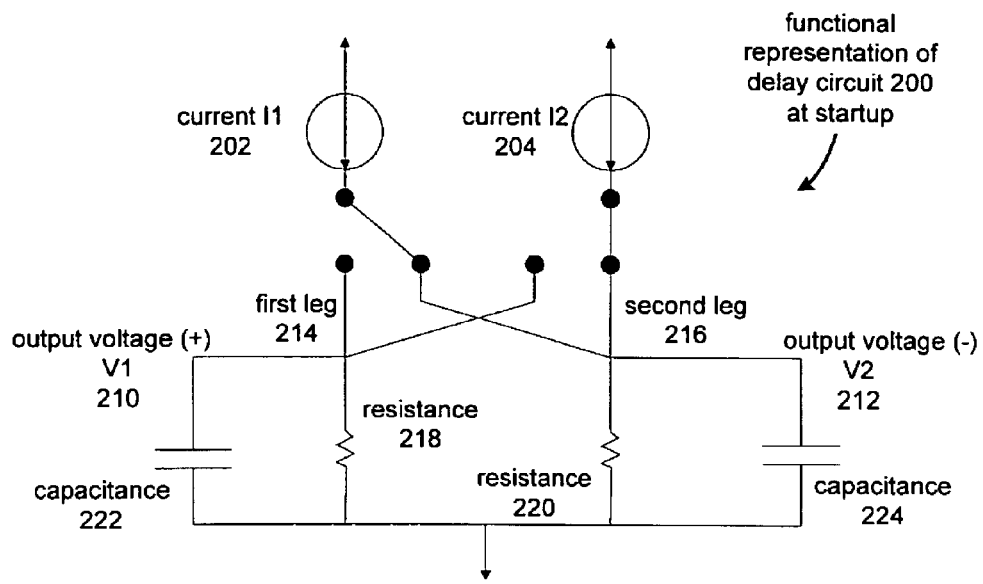
FIG. 4a is a functional representation of the startup condition of the delay circuit shown in FIG. 2.
Figure 4B:
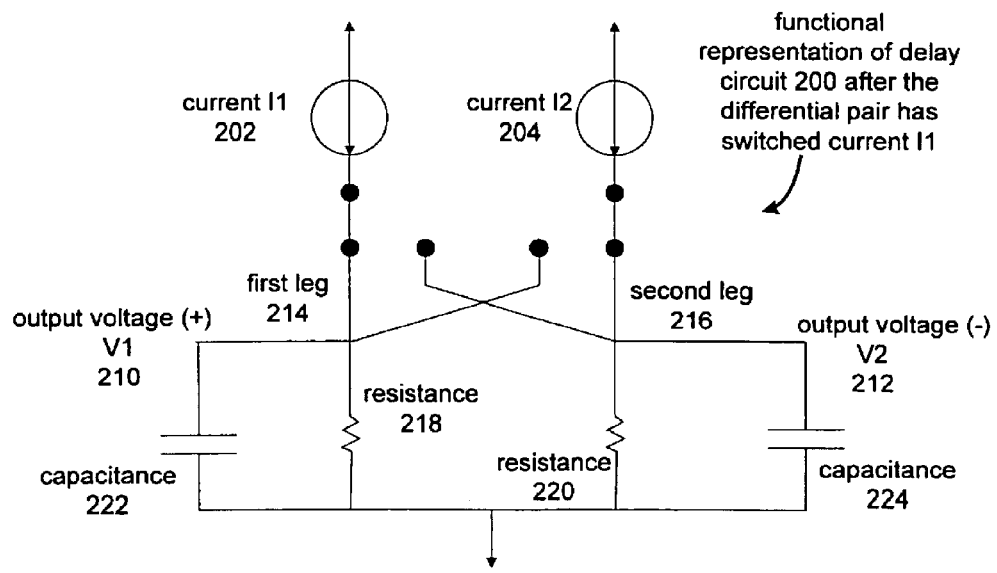
FIG. 4b is a functional representation of the delay circuit shown in FIG. 2 after the differential pair has switched one of the currents between the output legs.
Figure 4C:
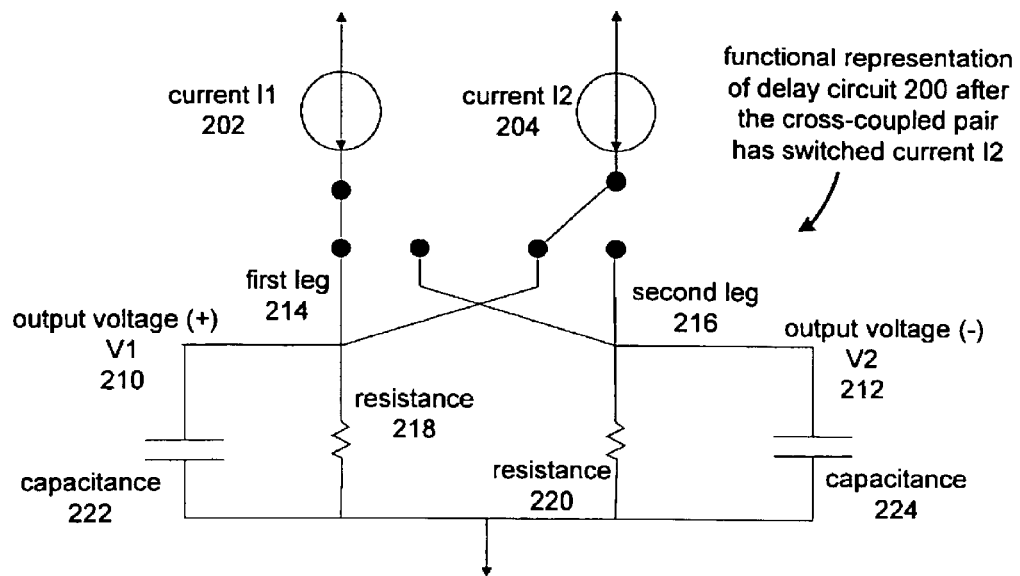
FIG. 4c is a functional representation of the delay circuit shown in FIG. 2 after the cross-coupled pair has switched one of the currents between the output legs.

FIG. 4a is a functional representation of the startup condition of the delay circuit 200 shown in FIG. 2, with a fixed resistive load. FIG. 4b is a functional representation of the delay circuit 200 after the differential pair switches current $I_1$ from a second output leg 216 to a first output leg 214. FIG. 4c is a functional representation of the delay circuit 200 after the cross-coupled pair switches current $I_2$ from the second leg 216 to the first leg 214.

In the example delay circuit 200, the first leg 214 of the circuit 200 has a resistance 218 of value R and a capacitance 222 of value C. A second leg 216 of the circuit 200 has a resistance 220 of value R and a capacitance 224 of value C. The RC values of both legs of the circuit 200 are held constant, and the delay of the circuit 200 is altered by changing $I_1$ and $I_2$. At the initial condition, shown in FIG. 4a, the first leg 214 of the delay circuit 200 has no current flowing in, while the second leg 216 of the delay circuit 200 gets both currents, $I_1$ and $I_2$. Therefore, the first leg 214 is charged to approximately 0V, while the second leg 216 is charged to $(I_1+I_2)*R$. So for the initial condition, the voltage $V_1$ (210) of the first leg 214 is $V_1=0V$, and the voltage $V_2$ (212) of the second leg 216 is $V_2=(I_1+I_2)*R$.

When the difference between input voltages 236 and 238 transitions, shown in FIG. 4b, $I_1$ is switched to the first leg 214 by the differential pair made up of MOSFETs 226 and 228. This causes the first leg to begin charging to $I_1*R$. The second leg 216 only has $I_2$ current, so it begins to discharge to $I_2*R$. When the output voltages of the two legs become equal ($V_1=V_2$), the next delay stage switches. At the time the next stage switches, shown in FIG. 4c, the cross-coupled pair 206 switches $I_2$ to the first leg 214, which causes the first leg 214 to further charge to $(I_1+I_2)*R$. The second leg 216 has no current, so the second leg 216 discharges to approximately 0V. This sets up the initial condition of the delay circuit for the next time the differential input voltage difference transitions. This setup condition has $V_1=(I_1+I_2)*R$ and $V_2=0V$.

The delay is defined by the time it takes the RC voltage rise of one output leg of the delay cell to equal the RC voltage decay of the other output leg after the difference of inputs voltages 236 and 238 transitions, switching the current $I_1$ from one output leg to the other output leg. The delay of circuit 200 is described by the following output voltage equivalence equation:

$$I_1R(1-e^{-1/RC})=(I_2+I_1)R-I_1R(1-e^{-1/RC}).$$

Therefore, the time delay $t=-RC\ln(1+I_1+I_2/2I_1)$.
The sum $I_C$ of the two currents is held constant: $I_C=I_1+I_2$.
For an N stage ring oscillator, the frequency can be modeled according to the following equation:

$$f = \frac{2I_1}{2NRC*I_C}.$$

Figure 1:
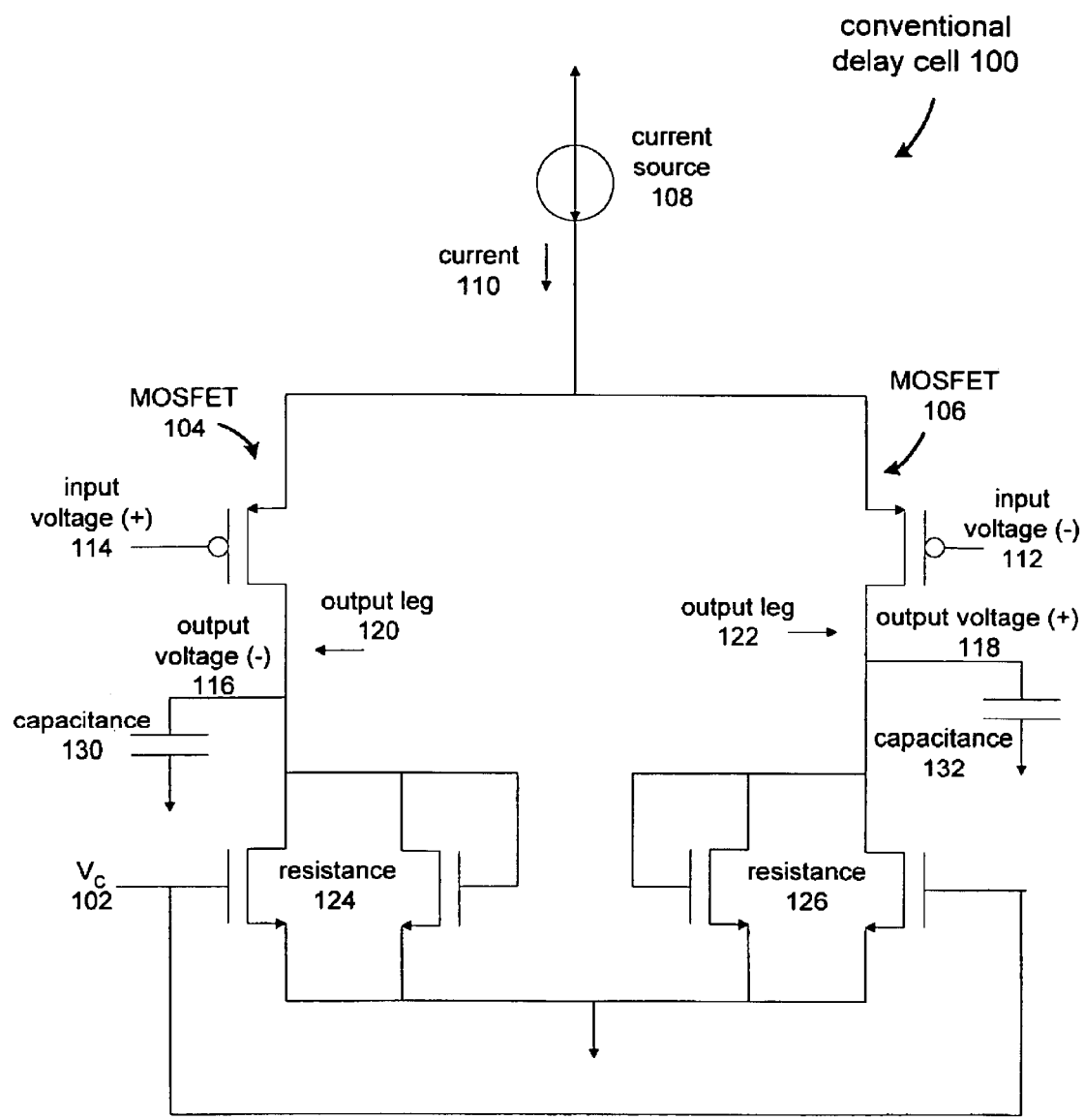
FIG. 1 is a circuit diagram illustrating a conventional delay cell.

The delay circuit 200 may also have a variable load, such as the voltage controlled resistance 102 shown in FIG. 1. This allows delay circuit 200 to have two controls. The variable resistance may be used to configure the center frequency or delay of a current controlled oscillator (ICO) or a current controlled delay (ICD) in order to reach a larger frequency or delay range. For example, while a voltage controlled oscillator (VCO) could use the current control to reach an approximately 2× range around a center frequency $F_{CENTER}$ under regular operation, the variable resistance control could be utilized to vary $F_{CENTER}$ by 8–10× in order to extend the total frequency range of the VCO. This could be done using fixed settings or dynamic digital or analog control. If done dynamically, the current control may act as a fine frequency control while the variable resistance acts as the coarse control.

The two controls could also be used to create a resistorless Phase Locked Loop (PLL) or Delay Locked Loop (DLL). In this case, the current control would be operated by the output of the phase detector and would operate at a number of discrete settings, such as high/low or high/low/center. This mimics the control zero produced by the resistor in the loop of a typical charge pump type PLL, causing a substantially instantaneous frequency shift for the duration of the phase detector correction. The variable resistance would control the average frequency and take as input a damped voltage generated by a charge pump or op-amp with a capacitive loop filter.

Figure 3:
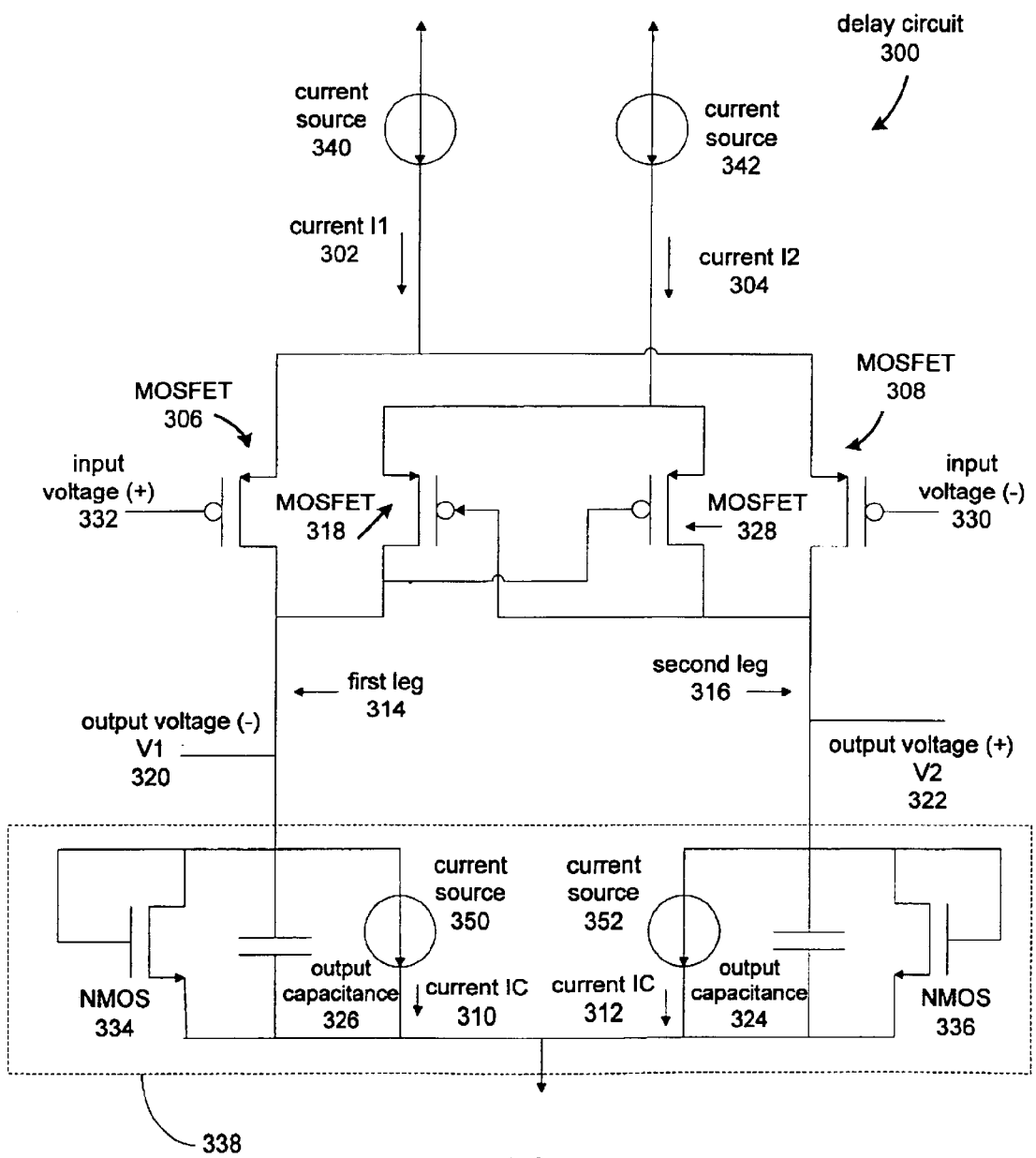
FIG. 3 is a circuit diagram illustrating an alternative embodiment of a current controlled delay circuit using a linear ramp based delay.

Referring to FIG. 3, a circuit diagram illustrating one embodiment of a current controlled delay circuit 300 is shown. The delay circuit 300 includes two current sources 340 and 342 to generate two currents, $I_1$ (302) and $I_2$ (304) of constant sum. The delay circuit 300 includes a differential pair made up of MOSFETs 306 and 308 to switch $I_1$ from one leg of the circuit to another leg of the circuit. The delay circuit 300 includes a cross-coupled pair made up of MOSFETs 318 and 328 to switch $I_2$ from one leg of the circuit to another leg of the circuit.

The delay circuit 300 includes a load 338 coupled to the differential pair and cross-coupled pair. The load 338 may be a fixed load or a variable load. In one embodiment, the load includes one or more current sources, such as 350 or 352, that generate a current $I_C$, such as 310 or 312. In one embodiment, the load 338 includes one or more MOSFETs to generate a current $I_C$, such as 310 or 312. In one embodiment, the load 338 includes one or more MOSFETs, such as 334 or 336, as output voltage limiting elements. In one embodiment, the load 338 includes one or more diodes as output voltage limiting elements. In one embodiment, the load 338 includes one or more output load capacitances, such as 324 or 326. In one embodiment, the load capacitances are the input capacitances of another current controlled delay cell.

Figure 5:
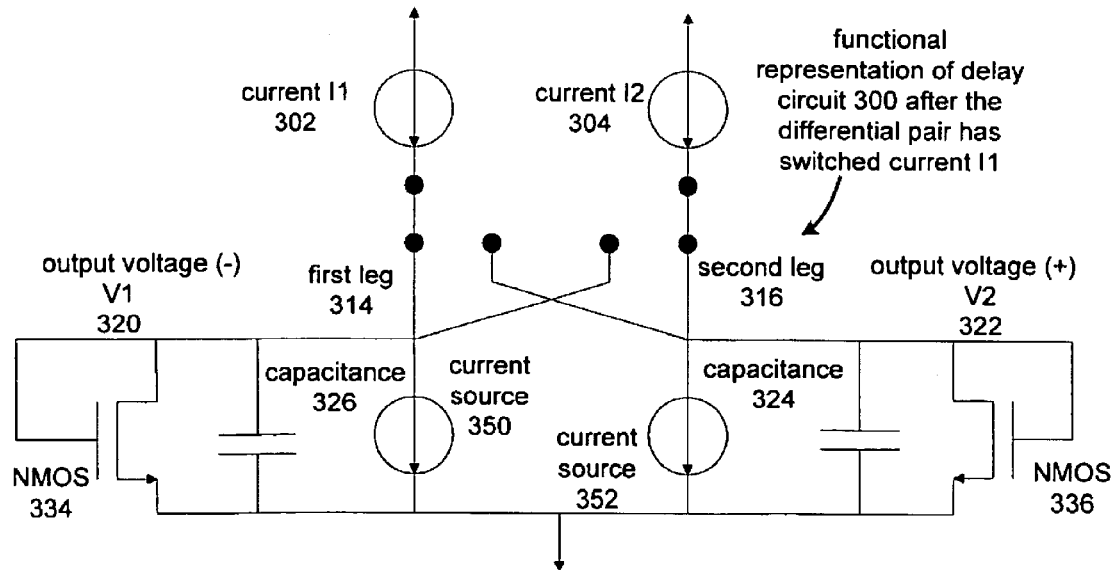
FIG. 5 is a functional representation of the delay circuit shown in FIG. 3 after the differential pair has switched one of the currents between the output legs.

The delay circuit 300 operates in a manner similar to that of the delay circuit 200 shown in FIG. 2. FIG. 5 is a functional representation of the delay circuit 300 shown in FIG. 3 after the differential pair switches current $I_1$ from a second output leg 316 to a first output leg 314. In the example delay circuit 300, the first leg 314 of the circuit 300 has a capacitance 326 of value C, a voltage limiting diode connected NMOSFET 334, and a current source 350 to generate a current 310 of value $I_C$. A second leg 316 of the circuit 300 has a capacitance 324 of value C, a voltage limiting diode connected NMOSFET 336, and a current source 352 to generate a current 312 of value $I_C$. In the example shown, the two currents $I_1$ and $I_2$ are held to a constant sum equal to $2I_C$. Initially, the first leg 314 of the circuit 300 has no current flowing in, while the second leg 316 of the circuit 300 gets both currents $I_1$ and $I_2$. Therefore, at time t=0, the voltage $V_1$ (320) of the first leg 314 is $V_1$=0V, and the voltage $V_2$ (322) of the second leg 316 is $V_2=V_{REF}=2I_C/G_m$, where $G_m$ is the transconductance of the voltage limiting diode connected NMOSFET.

When the difference between input voltages 330 and 332 transitions, $I_1$ is switched to the first leg 314 by the differential pair made up of MOSFETs 306 and 308. This causes the first leg 314 to begin charging and at time t, the voltage $V_1=(I_1-I_C)*t/C$. The second leg 316 begins to discharge, and at time t, the voltage $V_2=V_{REF}+(I_2-I_C)*t/C=V_{ref}-(I_1-I_C)*t/C$. When the output voltages of the two legs become equal ($V_1=V_2$), the next delay stage switches. At the time the next stage switches, the cross-coupled pair made of MOSFETs 318 and 328 switches $I_2$ to the first leg 314, so the first leg has a total current of value $I_C$. This causes the first leg to further charge. The first leg output voltage is limited by the voltage limiting diode connected NMOSFET to $V_{REF}=2I_C/G_m$. The second leg 316 has only the load sink current of $I_C$ and discharges to 0V. This sets up the initial condition of the delay circuit for the next time the differential input voltage difference transitions. This setup condition has $V_1=V_{REF}=2I_C/G_m$ and $V_2$=0V.

The delay of circuit 300 is defined by the time it takes the linear ramp voltage rise of one output leg of the delay cell to equal the linear ramp voltage fall of the other output leg after the difference of inputs 330 and 332 transitions, switching the current $I_1$ from one output leg to the other output leg. The delay of circuit 300 is described by the following output voltage equivalence equation:

$(I_1-I_C)*t/C=V_{REF}-(I_1-I_C)*t/C$.

Therefore the time delay $t=(V_{REF}*C)/[2*(I_1-I_C)]$.

For an N stage ring oscillator, the frequency $f=2*(I_1-I_C)/(V_{REF}*C*2N)$. The frequency range of a ring oscillator constructed with the delay circuit 300 is wider than the frequency range of a ring oscillator constructed with the delay circuit 200.

Figure 6:
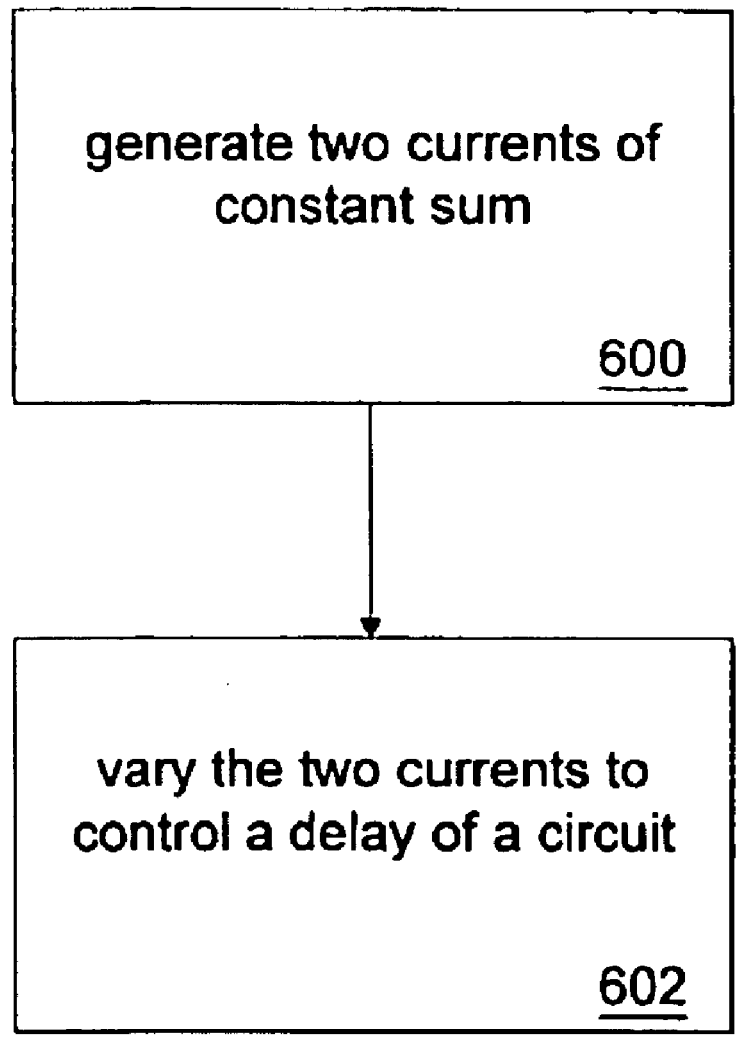
FIG. 6 is a flow diagram illustrating one embodiment of a method of using current to control delay.

Referring to FIG. 6, a flow diagram illustrating an embodiment of a method of using current to control the delay of a circuit is shown. At 600, two currents of constant sum are generated. At 602, the two currents are varied to control the delay of a circuit. In one embodiment, a first leg of the circuit is charged with the two currents. In one embodiment, one of the two currents is switched to a second leg of the circuit by a differential pair. In one embodiment, the circuit switches another circuit in the next stage when the voltage in the first leg is equal to the voltage in the second leg. In one embodiment, at the time the next stage switches, a cross-coupled pair coupled to the differential pair is used to switch the other of the two currents to the second leg of the circuit.

As will be appreciated by those skilled in the art, the content for implementing an embodiment of the method of the invention, for example, computer program instructions, may be provided by any machine-readable media which can store data that is accessible by a system incorporating the invention, as part of or in addition to memory, including but not limited to cartridges, magnetic cassettes, flash memory cards, digital video disks, random access memories (RAMs), read-only memories (ROMs), and the like. In this regard, the system is equipped to communicate with such machine-readable media in a manner well known in the art.

It will be further appreciated by those skilled in the art that the content for implementing an embodiment of the method of the invention may be provided to the system from any external device capable of storing the content and communicating the content to the system. For example, in one embodiment, the system may be connected to a network, and the content may be stored on any device in the network.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A circuit comprising:
   a first current source to generate a first current and a second current source to generate a second current, wherein a sum of the first current and the second current is constant;
   a differential pair coupled to the first current source, comprising:
      a first pair of transistors;
      a differential input having a differential input voltage comprising a first input voltage and a second input voltage; and
      a differential output having a differential output voltage comprising a first output voltage at a first leg of the circuit and a second output voltage at a second leg of the circuit, wherein
      the differential pair is configured to switch the first current from the second leg of the circuit to the first leg of the circuit in response to a transition of the differential input voltage; and
   a cross-coupled pair, comprising a second pair of transistors coupled to the differential output, the second current source, the first leg of the circuit and the second leg of the circuit, to switch the second current from the second leg of the circuit to the first leg of the circuit in response to a transition of the differential output voltage, wherein a time delay between the transition of the differential input and the transition of the differential output is a function of the ratio of the first current to the second current.

2. The circuit of claim 1, further comprising a load coupled to the differential pair and the cross-coupled pair through the first leg of the circuit and the second leg of the circuit, the load comprising a first load coupled to the first leg of the circuit and a second load coupled to the second leg of the circuit.

3. The circuit of claim 2, wherein each of the first load and the second load comprises a resistance and a capacitance, and wherein the time delay is a logarithmic function of the sum of the first current and the second current.

4. The circuit of claim 3, wherein the resistance comprises a voltage controlled resistance.

5. The circuit of claim 4, wherein the voltage controlled resistance comprises a metal-oxide field effect transistor (MOSFET).

6. The circuit of claim 2, wherein
the first load comprises a first capacitance, a first voltage limiter and a third current source to generate a third current, the second load comprises a second capacitance, a second voltage limiter and a fourth current source to generate a fourth current, and wherein
the third current equals the sum of the first current and the second current and the fourth current equals the sum of the first current and the second current.

7. The circuit of claim 6, wherein the time delay is a linear function of the sum of the first current and the second current.

8. A method in a circuit, comprising:
generating a first current in a differential pair from a first current source and a second current in a cross-coupled pair from a second current source, wherein a sum of the first current and the second current is constant, and wherein the differential pair and the cross-coupled pair have a first output in common and a second output in common, the first output and the second output comprising a differential output of the differential pair;
summing the first current and the second current at the second output; and
varying a ratio of the first current to the second current to control a time delay between a differential input of the differential pair and the differential output of the differential pair.

9. The method of claim 8, wherein the first output is coupled to a first output leg of the circuit and the second output is coupled to a second output leg of the circuit, further comprising charging the second output leg of the circuit to a first output voltage with the first current and the second current.

10. The method of claim 9, further comprising:
switching the first current from the second output leg of the circuit to the first output leg of the circuit;
charging the first output leg of the circuit to a second output voltage with the first current; and
discharging the second output leg of the circuit to a third output voltage less than the second output voltage.

11. The method of claim 10, wherein the second output voltage and the third output voltage are coupled to an other circuit, further comprising switching the other circuit when the third output voltage is less than the second output voltage.

12. The method of claim 11, further comprising:
switching the second current from the second output leg of the circuit to the first output leg of the circuit;
charging the first output leg of the circuit to a fourth output voltage; and
discharging the second output leg of the circuit to a fifth output voltage.

13. The method of claim 10, further comprising:
loading the first output leg of the circuit of the circuit with a first resistance and capacitance comprising a resistance-capacitance (RC) product;
loading the second output leg of the circuit of the circuit with a second resistance and capacitance comprising the RC product, wherein
the time delay is a linear function of the RC product and a logarithmic function of the sum of the first current and the second current.

14. The method of claim 10, further comprising:
loading the first output leg of the circuit with a first capacitance, a first voltage limiter and a third current source;
loading the second output leg of the circuit with a second capacitance, a second voltage limiter and a fourth current source, wherein
the third current equals the sum of the first current and the second current and the fourth current equals the sum of the first current and the second current, and wherein
the time delay is a linear function of the sum of the first current and the second current.

15. A ring oscillator, comprising:
a plurality of current controlled delay cells, each cell comprising:
a first current source to generate a first current and a second current source to generate a second current, wherein a sum of the first current and the second current is constant;
a differential pair coupled to the first current source, comprising:
a first pair of transistors;
a differential input, comprising a differential input voltage; and
a differential output, comprising a differential output voltage at a second leg of the circuit, wherein
the differential pair is configured to switch the first current from the second leg of the circuit to the first leg of the circuit in response to a transition of the differential input voltage; and
a cross-coupled pair, comprising a second pair of transistors coupled to the differential output, the second current source, the first leg of the circuit and the second leg of the circuit, to switch the second current from the second leg of the circuit to the first leg of the circuit in response to a transition of the differential output voltage, wherein a time delay between the transition of the differential input and the transition of the differential output is a function of the sum of the first current and the second current, wherein
the differential output of each cell is coupled to the differential input of one other cell, wherein the differential output of a last cell is coupled to the differential input of a first cell, and wherein a frequency of oscillation of the plurality of cells is inversely proportional to the time delay.

* * * * *